(12) United States Patent
Yazdani (10) Patent No.: US 8,014,166 B2
(45) Date of Patent: Sep. 6, 2011

(54) STACKING INTEGRATED CIRCUITS CONTAINING SERIALIZER AND DESERIALIZER BLOCKS USING THROUGH SILICON VIA

(75) Inventor: Farhang Yazdani, Bellevue, WA (US)

(73) Assignee: Broadpak Corporation, Las Vegas, NV (US)

( * ) Notice: Subject to any disclaimer, the term of this patent is extended or adjusted under 35 U.S.C. 154(b) by 340 days.

(21) Appl. No.: 12/205,875

(22) Filed: Sep. 6, 2008

(65) Prior Publication Data
US 2010/0058580 A1    Mar. 11, 2010

(51) Int. Cl.
*H05K 1/11* (2006.01)
(52) U.S. Cl. ........................ 361/790; 361/803

(58) Field of Classification Search ............. 361/790, 361/760, 803; 257/777
See application file for complete search history.

(56) References Cited

U.S. PATENT DOCUMENTS

| | | | |
|---|---|---|---|
| 7,317,256 B2 * | 1/2008 | Williams et al. | 257/777 |
| 2004/0012938 A1 * | 1/2004 | Sylvester et al. | 361/794 |
| 2010/0008058 A1 * | 1/2010 | Saen et al. | 361/803 |
| 2010/0315787 A1 * | 12/2010 | Li et al. | 361/709 |
| 2011/0019368 A1 * | 1/2011 | Andry et al. | 361/748 |

* cited by examiner

*Primary Examiner* — Yuriy Semenenko
(74) *Attorney, Agent, or Firm* — Maxvalueip, LLC (57) ABSTRACT

Methods and systems for stacking multiple chips with high speed serialiser/deserialiser blocks are presented. These methods make use of Through Silicon Via (TSV) to connect the dice to each other, and to the external pads. The methods enable efficient multilayer stacking that simplifies design and manufacturing, and at the same time, ensure high speed operation of serialiser/deserialiser blocks, using the TSVs.

20 Claims, 10 Drawing Sheets

STACKING INTEGRATED CIRCUITS CONTAINING SERIALIZER AND DESERIALIZER BLOCKS USING THROUGH SILICON VIA

BACKGROUND OF THE INVENTION

A Serializer/Deserializer (SER/DES) is a pair of functional blocks [integrated circuits or IC/chip] commonly used in high speed communications. These blocks convert data between serial data and parallel interfaces in each direction. Although the term "SER/DES" is generic, in speech it is sometimes used as a more pronounceable synonym for Serial Gigabit Media Independent Interface (SGMII).

SER/DES chips facilitate the transmission of parallel data between two points over serial streams, reducing the number of data paths and thus, the number of connecting pins or wires required. Most SER/DES devices are capable of full duplex operation, meaning that data conversion can take place in both directions simultaneously. SER/DES chips are used in many application including Gigabit Ethernet systems, wireless network routers, fiber optic communications systems, storage applications just to name a few.

Specifications and speeds vary depending on the needs of the user and on the application. These blocks are often integrated within another Integrated Circuit (i.e. ASIC).

Figure 1:
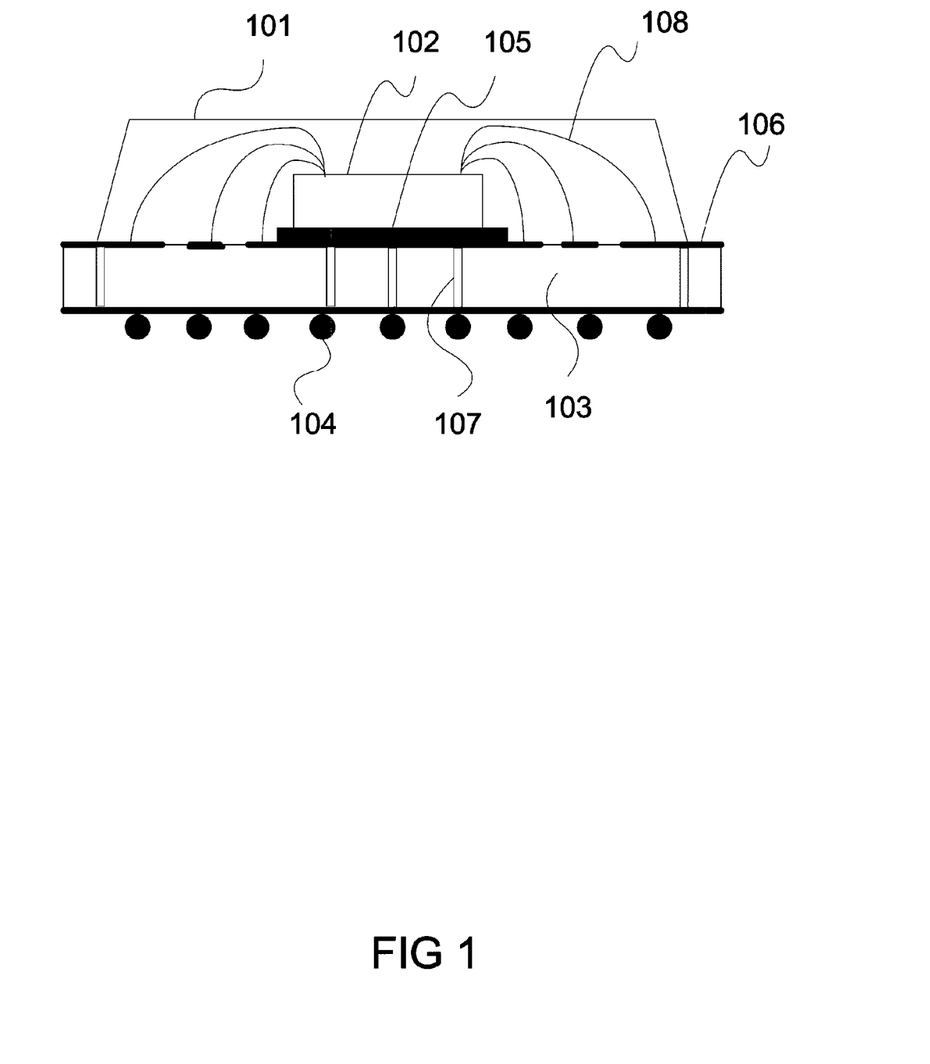
FIG. 1 shows an example of chip with wirebonded package.
Figure 2:
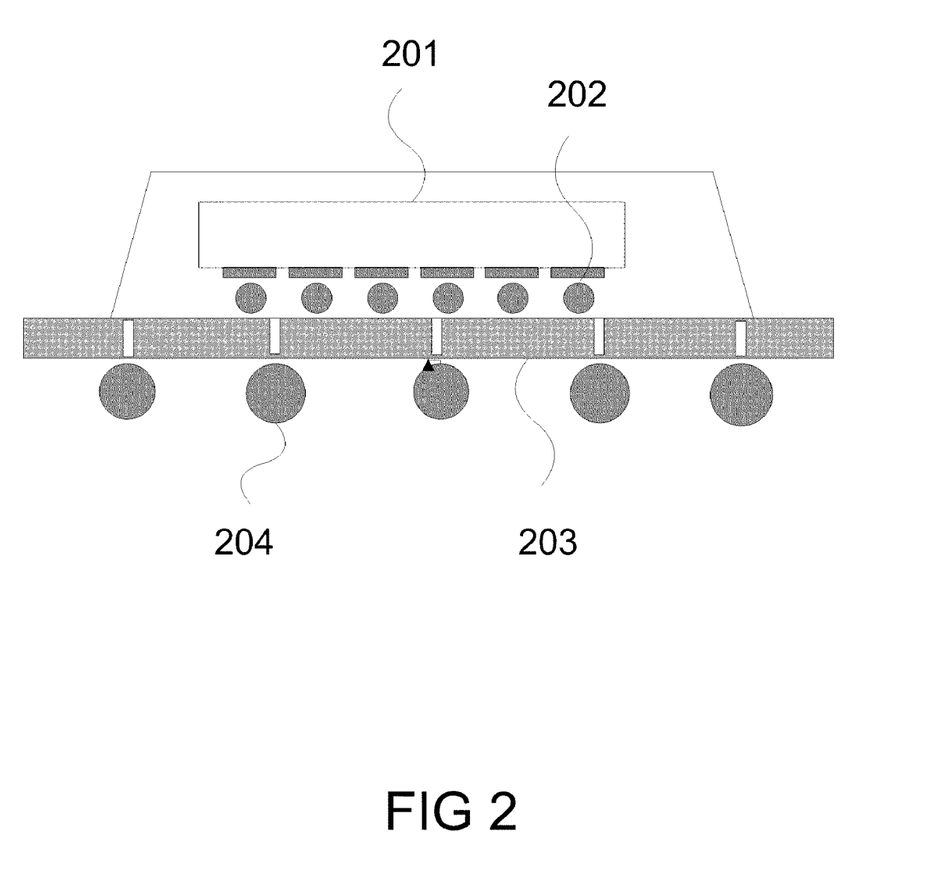
FIG. 2 shows an example of chip with Flip Chip package.

The quest for "smaller, chipper, faster" devices is ever increasing. IC packaging is one area that this quest is continuously challenged. In IC packaging chips are mounted on and connected to a rigid laminate (substrate) via wirebonds (FIG. 1) or bumps in flip chip (FIG. 2) applications. In wirebond technology (FIG. 1) the silicon die (102) is connected via wires (108) to solder mask (106) over a rigid laminate (103). The solder mask (106) is then connected to solder balls (104) through Via holes (107) inside the rigid laminate (103). In flip chip technology (FIG. 2), the silicon die (201) is connected to a substrate (203) via balls (202) and the substrate (203) routes the metal to proper solder balls (204).

Packaging SER/DES is a very challenging and specialized area in the world of IC packaging. With higher data rate flip chips are adapted for packaging high speed SER/DES because in Flip Chip packaging wirebonds are replaced by conductive solder bumps thereby wirebond inductance is no longer present.

Figure 3:
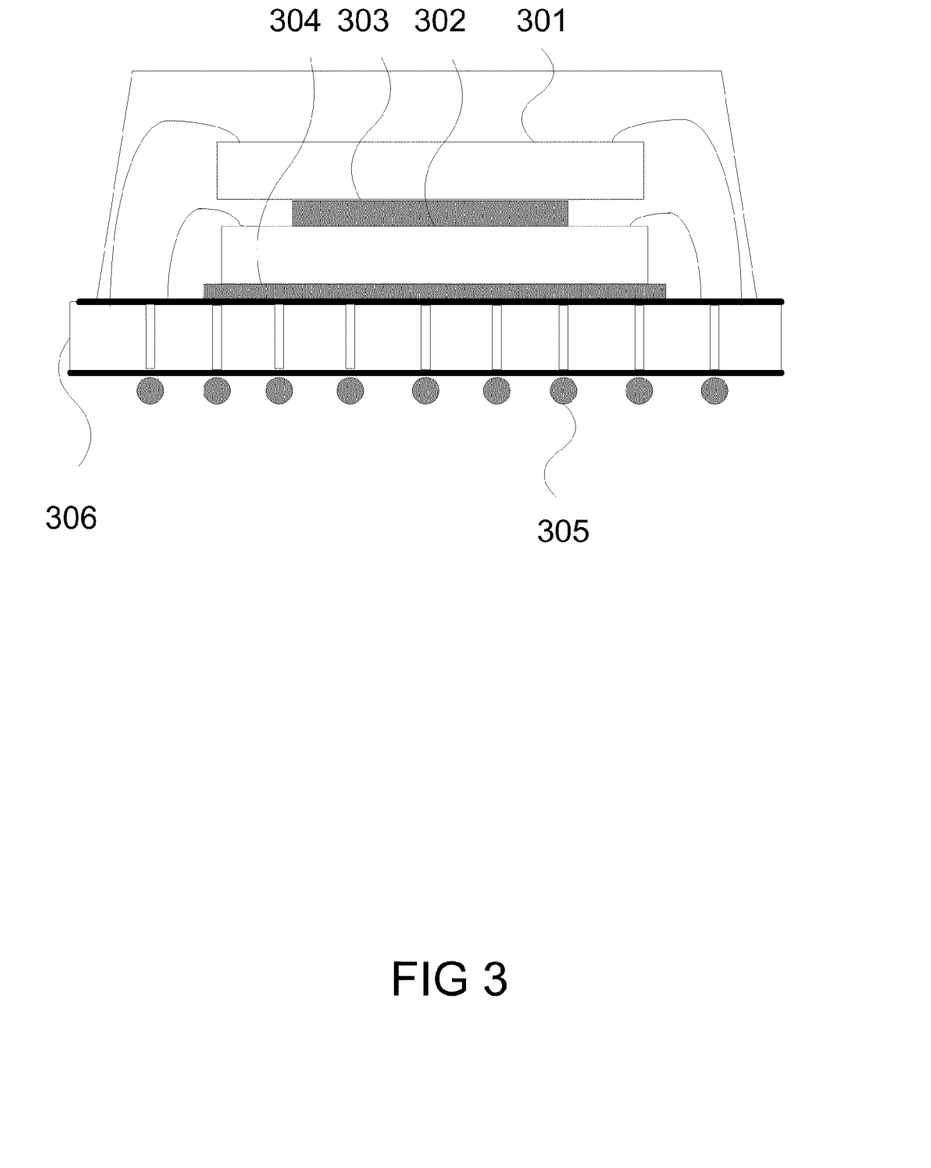
FIG. 3 shows an example of stacked die packing of two chips of the same size using wirebond.
Figure 4:
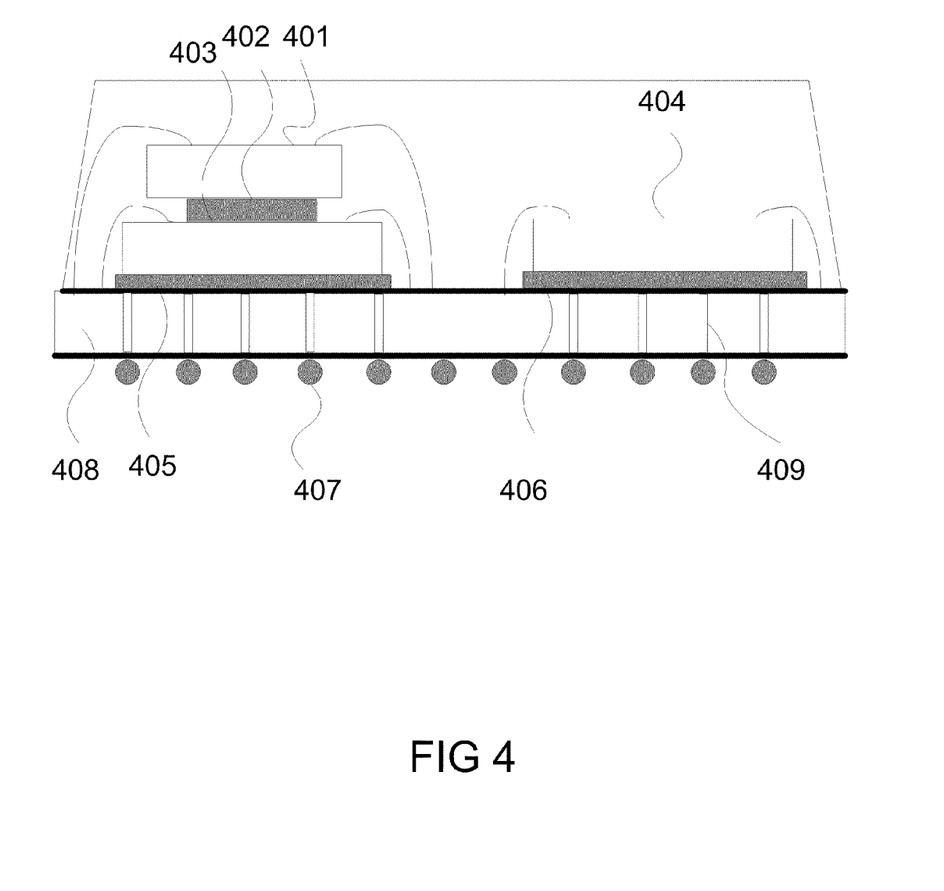
FIG. 4 shows an example of stacked die packing of two chips with a separate SER/DES die in the same package using wirebond.

At the present, industry is moving toward 3D packaging where two or more dice are stacked on the top of each other or packages are stacked on the top of packages. These packaging methods offer high density integration in smaller footprint making it suitable for applications in which size matters such as cell phone. FIG. 3 is an example of two equal size chips placed vertically in the same package, in which the chips are connected to the solder balls (305) using wirebond technology. As can be seen from FIG. 3, a first die (301) is placed above a second dies (302), which in turn is placed above a substrate (306). A spacer (303) is placed between the two dies. Another spacer (304) is placed between the bottom die (302) and the substrate (306). FIG. 4 is another example of 3D chip stacking in which the SER/DES die (404) is not stacked and is positioned as a side die beside the stacked dice (401 and 403).

The drawback of stacked die packaging is the use of wirebond, making it unsuitable for high speed SER/DES packaging. In order to circumvent this impediment, this invention proposes to use Through Silicon Via (TSV) to connect dice vertically.

The benefits of using TSV to connect dice vertically are:

1. Higher degree of miniaturization: By placing TSV within the SER/DES block one can facilitate the connection of the die above or below that would otherwise be placed side by side. In a case where non SER/DES dice are stacked with wirebond and SER/DES die is placed next to it, using TSV will eliminate all wires.
2. Placing TSV makes it possible to stack two or more dice with SER/DES block
3. Electrical superiority: When using TSV, it is possible to stack and connect very high data rate SER/DES blocks vertically without the need for any wire.
4. Better thermal performance: The TSV placed within the SER/DES block provides a highly conductive passage for heat removal from the die above.
5. No need for spacer material: Normally, thick Spacer materials are placed between the dice to make wire-bonding of same or different die size possible. Using TSV eliminates the need for this material thereby reducing the cost as well as decreasing the overall height of the package making it possible to fit the package in places where height is a constraint such as very thin cell phones.

This patent claims the placement of TSV within the SER/DES block to enable high density packaging of dice with SER/DES blocks or any other block.

SUMMARY OF THE INVENTION

This invention uses techniques to enable connecting multiple chips (dice) vertically to create a compact 3D chip package. Specifically, it uses techniques that enable high speed SER/DES circuits get connected between multiple dice or from a die to external pins via Through Silicon Via (TSV) that will reduce or eliminate the inductance and capacitance associated with otherwise using wirebond. The techniques for stacking multiple high speed chips enables efficient routing of TSV between different dice that simplifies 3D chip design and manufacturing by providing guidelines on positioning and aligning the chips and by providing guidelines for creating redistribution layer (RDL) and routes that are resistant to stress.

DETAILED DESCRIPTION OF THE PREFERRED EMBODIMENTS

To create a more compact and space efficient integrated circuit, it is necessary to be able to stack multiple dice on top of each other. Two general methods are possible for interconnecting the stacked dice to each other and for connecting those dice to the pins or solder balls of the 3D chip package. One method is to use wirebond, meaning that to use wires to connect chips to each other or to the pins of the 3D package as shown in FIG. 3 and FIG. 4. The wirebond technique is not very useful for high speed SER/DES due to creation of inductance and capacitance.

Figure 8:
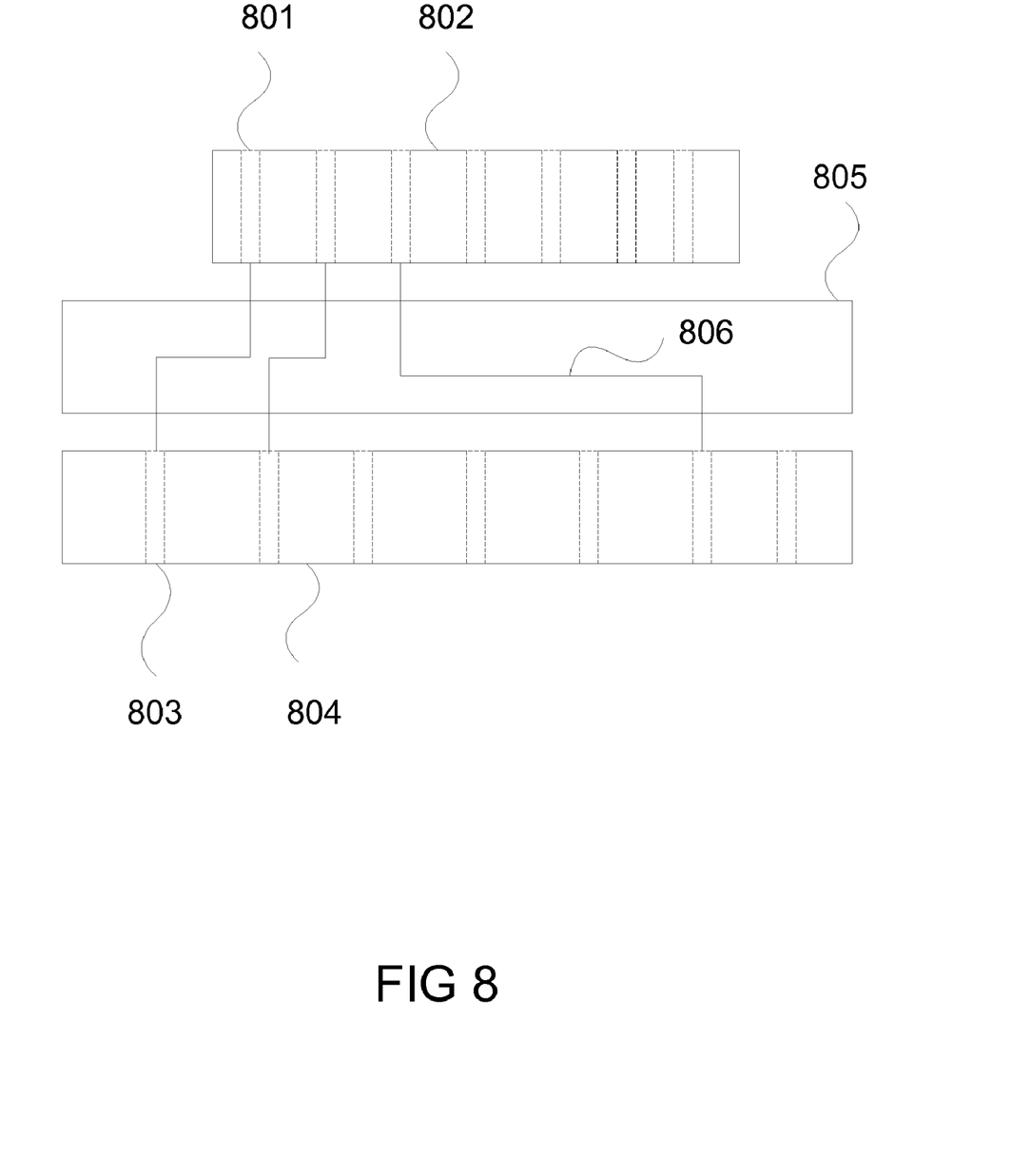
FIG. 8 shows two chips with TSVs connected to each other through a redistribution layer (Interposer).
Figure 9:
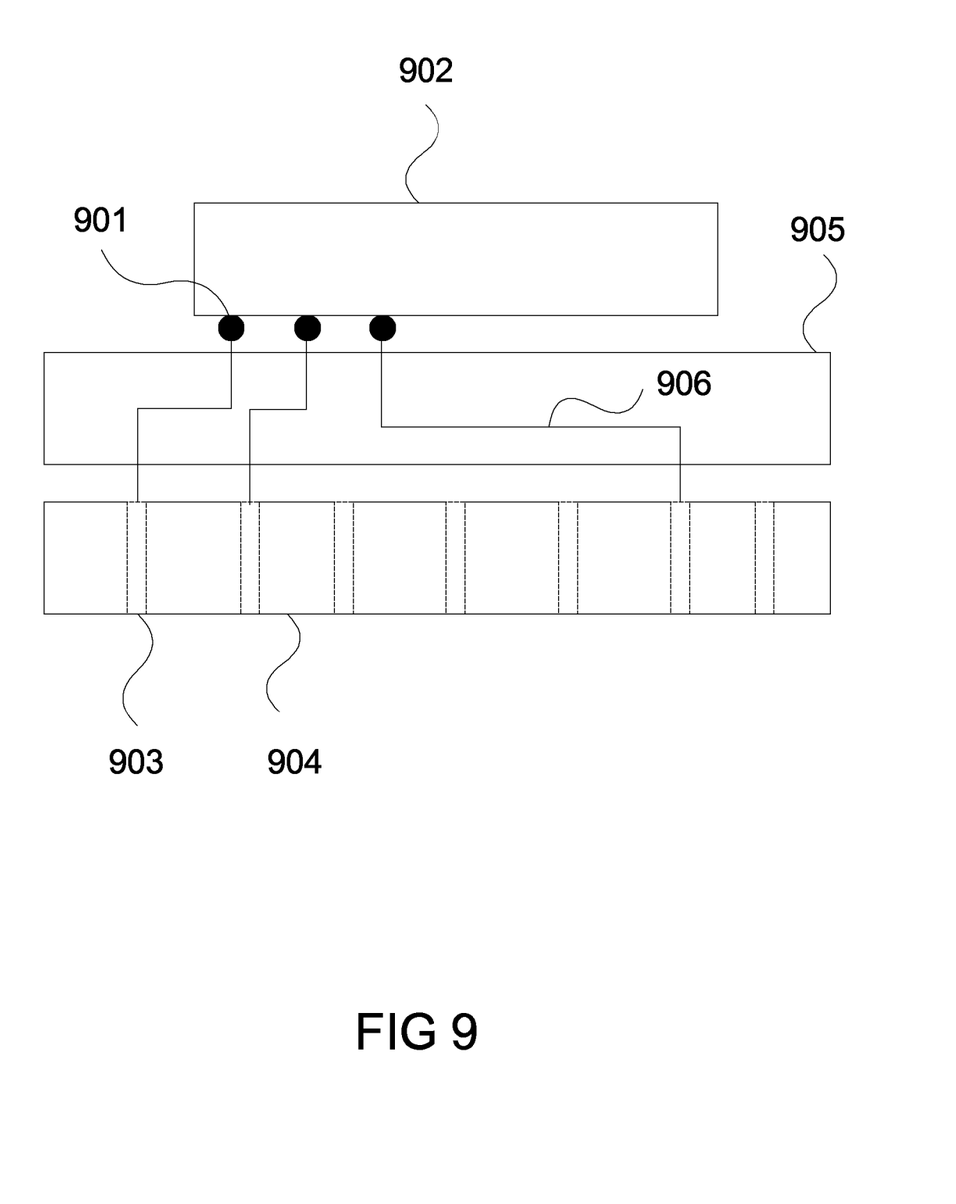
FIG. 9 shows TSVs of one chip connected to the pads of another chip through a redistribution layer (Interposer).

Another technique is to use Through Silicon Via (TSV) to connect multiple stacked dice to each other or to the external pins. FIG. 8 shows an example of TSVs (801, 803) of two dice (802, 804) connected to each other. While FIG. 9 shows the contact pads (901) of one die (902) is connected to the TSVs (903) of another die (904). TSVs has so far been only used for lower speed integrated circuits. This patent extends the TSV technology for usage with high speed SER/DES circuits. Doing so would eliminate the need for wirebond and would create a more compact package with superior electrical and thermal characteristics.

Figure 10:
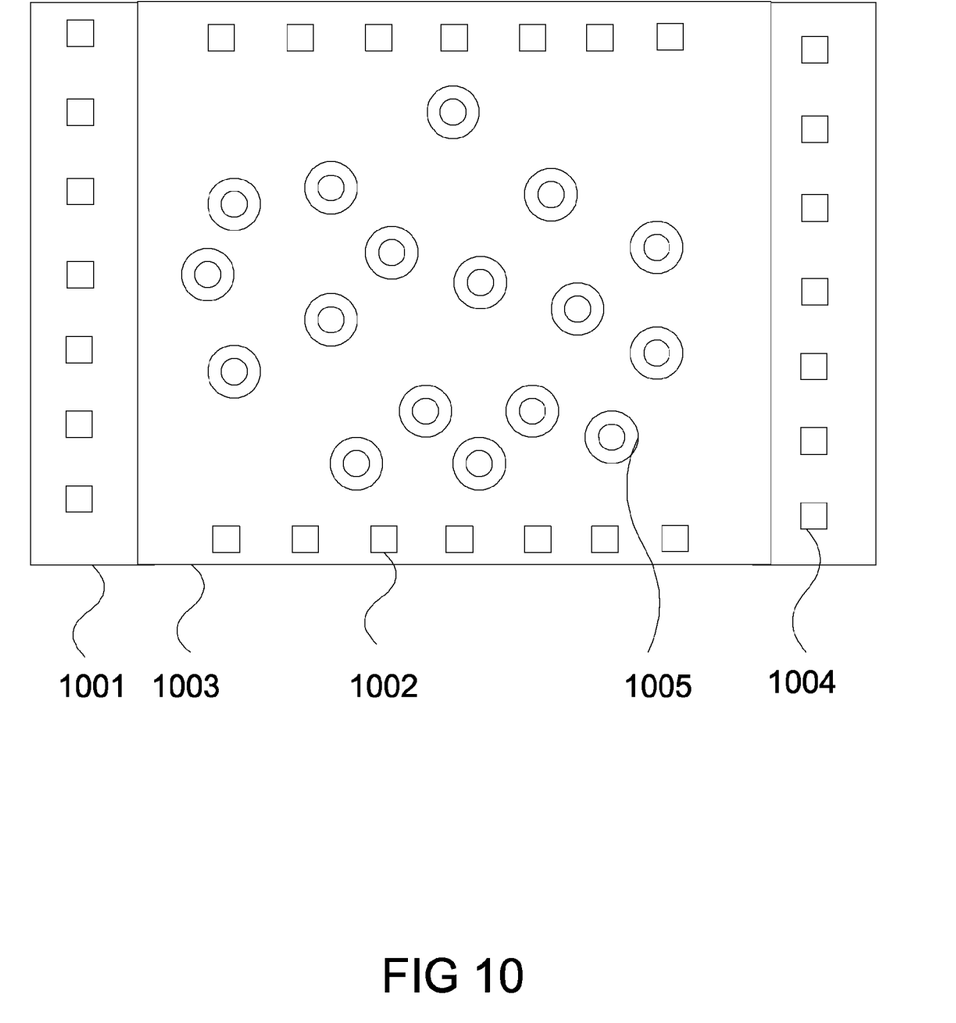
FIG. 10 shows the location of test pads at the very edge of dice, when they are stacked on each other.

And, finally, to test dice which are stacked on each other, test pads need to be created for each die. The test pads must be located at the extreme periphery or edge of dice. FIG. 10 shows two dice (1001, 1003) are stacked on top of each other, They both have TSVs (1005) and the test pads (1002, 1004) are placed at the edge of these dice.

In order to successfully use TSV for the SER/DES circuits a number of rules have to be followed. This patent provides the techniques for using TSV in high speed SER/DES block of chips that could be used for connecting the SER/DES circuit to external pins.

Figure 5:
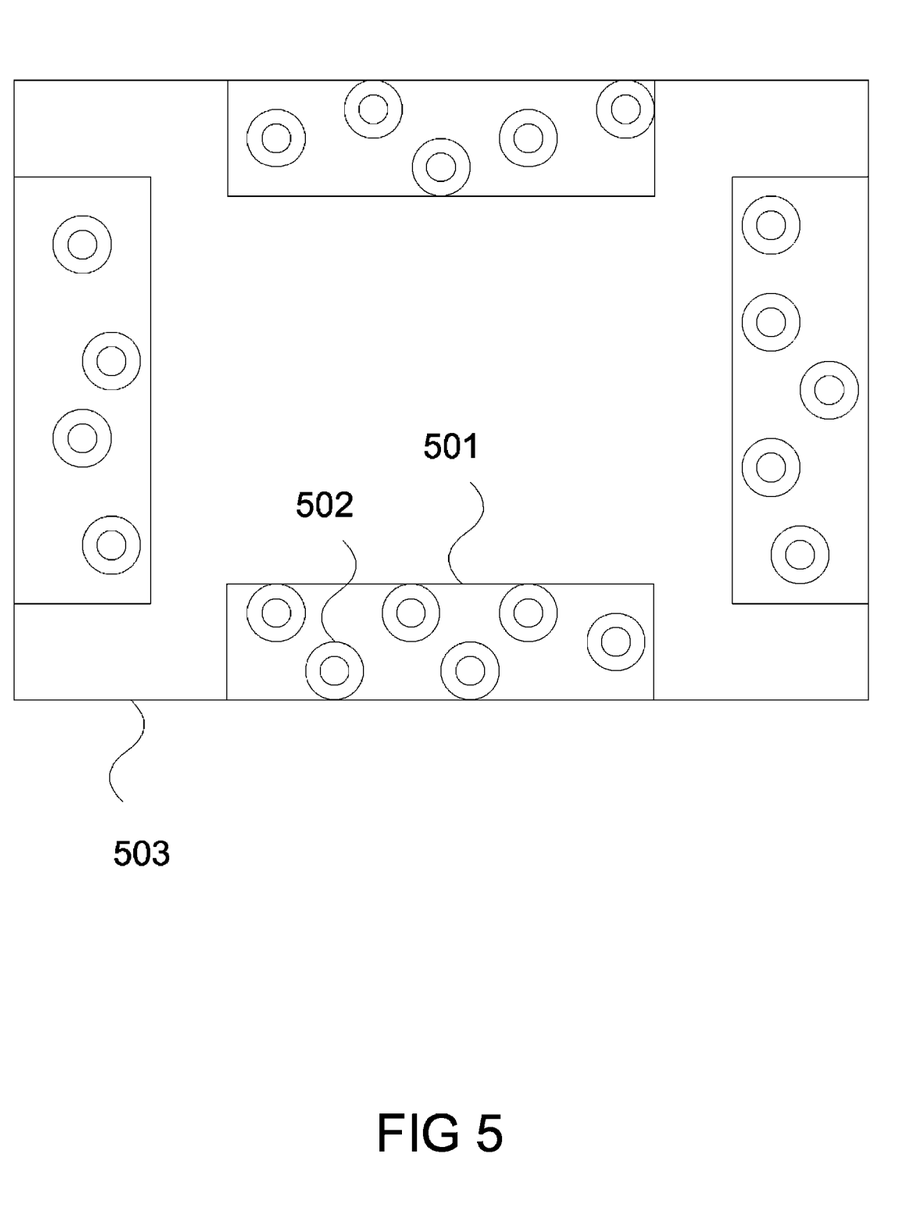
FIG. 5 shows an example of Trough Silicon Via (TSV) on the SER/DES blocks of a chip placed at the peripheries of the chip.

The first technique is to have the SER/DES blocks that use TSV at one or more peripheries of the die. FIG. 5 is an example of such method in which four SER/DES blocks (501) are used at the four peripheries of the die (503) and the SER/DES blocks are equipped with TSVs (502) that can be used to pass through lower dice and get connected to external pins or other dice.

The second technique is to try to limit the SER/DES blocks that use TSV to one or more peripheries of the die and rotate the upper and lower stacked dice by 90 degrees or have the SER/DES staggered so that the SER/DES blocks of those dice will not block each other. This method makes the TSV creation and routing in the interposer layer much easier.

Figure 6:
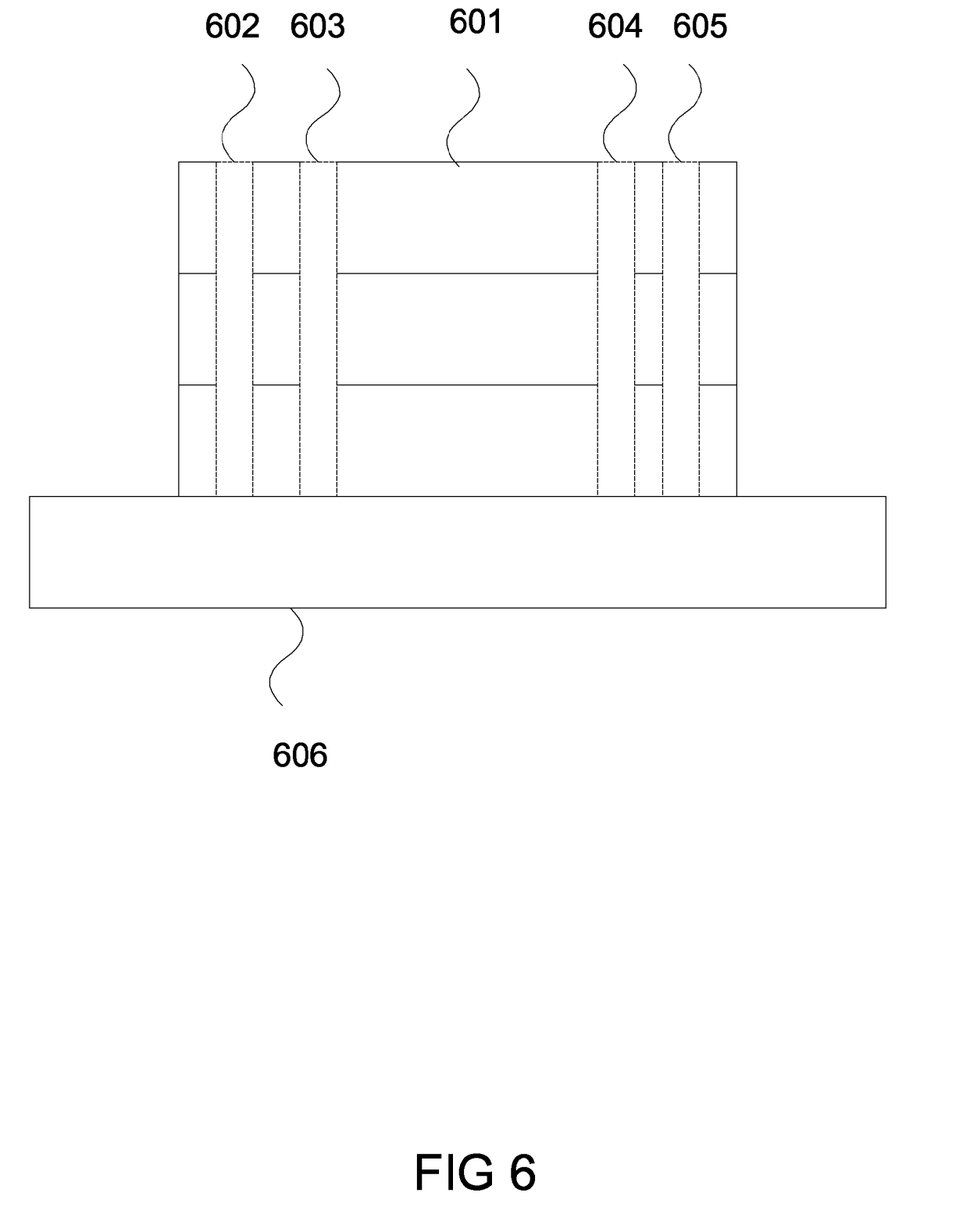
FIG. 6 shows three stacked chips connected to substrate via TSVs.
Figure 7:
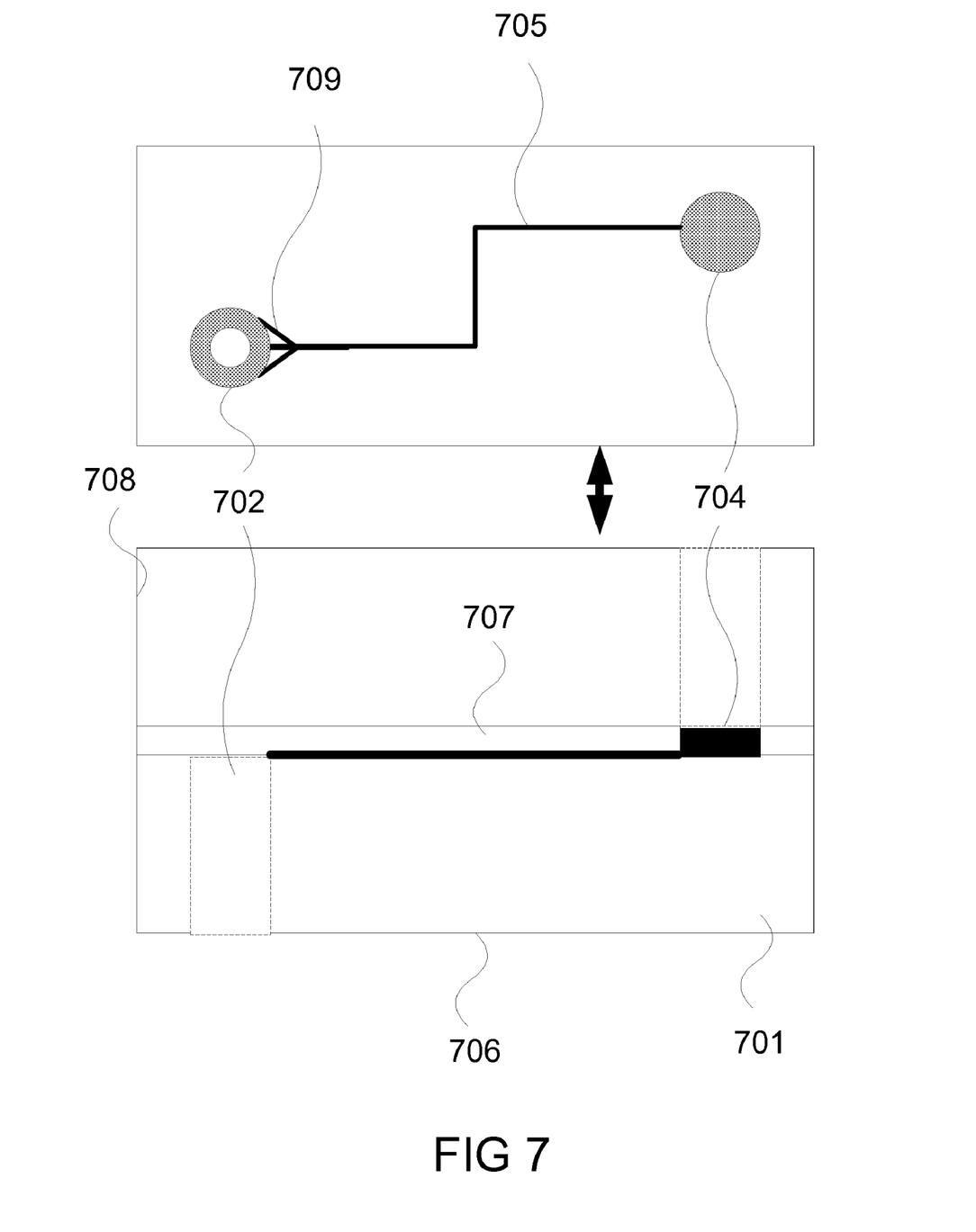
FIG. 7 shows redistribution layer (Interposer) that is used to route and connected TSVs and Pads.

The third technique is to use a redistribution layer (RDL) or interposer when TSVs of the lower and upper die can't be aligned to each other. Redistribution layer (RDL) is used to route and connect TSV to "contact pad". The trace routes can be of any shape, angle or material. There could be solder resist on the top of RDL and adhesive such as (BCB), etc. FIG. 6 shows an example in which the TSVs of 3 stacked dice are aligned to each other and therefore no RDL is required. While FIG. 7 shows an example, in which the TSVs of the two dice (706, 708) are not aligned to each other and therefore an RDL (707) is required between two dice (706, 708) to route the TSVs. The RDL may contain TSV, blind via, buried via, or any combination of via. The RDL may or may not contain plans, or passive elements such as capacitors. FIG. 8 shows another example of a RDL (805) that is used to connect the via (801) of the top die (802) to the via (803) of the bottom die (804).

The fourth technique is the method for aligning stacked dice. Dice can be aligned using fiducials of any type, such as cross, square, circle, +, □, =, etc, or any text character. Fiducials can be used on the interposer and/or dice for the purpose of alignment. The interposer and dice can have one, two or as many Fiducials, as needed.

The fifth technique is to create (deposit) contact pads on RDL to create a contact point for the other dice TSV. This pad can of any material, size or shape. A circular contact pad (704) is shown in FIG. 7 that resides in the RDL (707). The contact pad (704) is used to connect the TSV of the upper layer (708) to the trace (705) on the RDL and subsequently to the TSV of the lower die (702).

The sixth technique is use tear drops for connecting traces on the RDL to TSVs for the purposes of reinforcement and stress reduction. FIG. 7 shows an example of a tear drop (709) on the TSV of the lower die (702).

The seventh technique is mix wirebond and TSV in stacked chips. Wirebond could be used for low speed digital circuits, while TSV could be used for the high speed SER/DES circuits.

The eight technique is to place the test pads for testing a die that uses TSV at the extreme periphery of the die.

Any variations of the above are also intended to be covered by the application here.

The invention claimed is:

1. A system for stacking Integrated Circuits vertically to create a three dimensional chip package, said system comprising:
   silicon dies;
   one or more redistribution layers;
   one or more through silicon vias through said silicon dies;
   one or more contact pads;
   serial circuits;
   wherein said silicon dies comprise said serial circuits;
   wherein said serial circuits are staggered on said silicon dies;
   wherein said silicon dies are stacked vertically on top of each other in such a way that said serial circuits of said stacked silicon dies do not block each other;
   wherein one or more fiducials are placed to optically align said silicon dies that are stacked vertically on top of each other;
   wherein said one or more through silicon vias are placed in said serial circuits;
   wherein at least one of said one or more redistribution layers is placed between two of said silicon dies;
   wherein said silicon dies along with said one or more redistribution layers are stacked on top of a substrate;
   wherein said one or more contact pads are placed on said substrate;
   wherein said one or more redistribution layers are positioned to interconnect said one or more through silicon vias belonging to said two of said silicon dies and to interconnect said one or more through silicon vias to said one or more contact pads.

2. A system as stated in claim 1, wherein said one or more fiducials are one of cross, square, circle, or equal symbols.

3. A system as stated in claim 1, wherein said serial circuits are placed at one or more peripheries of said silicon dies, and wherein said silicon dies are stacked vertically on top of each other by rotating said silicon dies in multiples of ninety degrees in such a way that said serial circuits placed at said one or more peripheries of said stacked silicon dies do not block each other.

4. A system as stated in claim 1, wherein said silicon dies and said one or more redistribution layers comprise said one or more through silicon vias, blind vias, buried vias, or any combination of vias.

5. A system as stated in claim 1, wherein said one or more contact pads are positioned on said one or more redistribution layers to create contact point for said one or more through silicon vias.

6. A system as stated in claim 1, wherein teardrop connections are placed for connecting traces on said one or more redistribution layers to said one or more through silicon vias.

7. A system as stated in claim 1, wherein said silicon dies comprise digital circuits.

8. A system as stated in claim 1, wherein said silicon dies connect through said one or more through silicon vias for said serial circuits and through wirebonds for digital circuits.

9. A system as stated in claim 1, wherein said chip package comprises flip-chip technology.

10. A system as stated in claim 1, wherein one or more of said serial circuits are Serial Gigabit Media Independent Interface type.

11. A system as stated in claim 1, wherein said serial circuits operate in a full-duplex mode.

12. A system as stated in claim 1, wherein said serial circuits operate at radio frequencies.

13. A system as stated in claim 1, wherein said one or more through silicon vias are scattered in middle of said silicon dies, and one or more test pads are placed at the extreme periphery of said silicon dies.

14. A system as stated in claim 1, wherein said one or more redistribution layers contain circuit components or interconnects.

15. A system as stated in claim 1, wherein said a three dimensional chip is placed in a Gigabit Ethernet system.

16. A system as stated in claim 1, wherein said a three dimensional chip is placed in a wireless network router.

17. A system as stated in claim 1, wherein said a three dimensional chip is placed in a fiber optic communication or storage system.

18. A system as stated in claim 1, wherein said a three dimensional chip is placed in a cellular phone.

19. A system as stated in claim 1, wherein said one or more contact pads are circular.

20. A system as stated in claim 1, wherein said one or more redistribution layers are covered with a solder resist or adhesive.

* * * * *